(12) United States Patent
Watanabe et al.

(10) Patent No.: US 9,006,876 B2
(45) Date of Patent: Apr. 14, 2015

(54) SEMICONDUCTOR APPARATUS AND MANUFACTURING METHOD THEREOF

(71) Applicant: Fujitsu Limited, Kawasaki-shi, Kanagawa (JP)

(72) Inventors: Manabu Watanabe, Yokohama (JP); Kenji Fukuzono, Kawasaki (JP); Shunji Baba, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/225,721

(22) Filed: Mar. 26, 2014

(65) Prior Publication Data

US 2014/0319667 A1      Oct. 30, 2014

(30) Foreign Application Priority Data

Apr. 30, 2013   (JP) ................. 2013-095562

(51) Int. Cl.
*H01L 23/02* (2006.01)
*H01L 23/34* (2006.01)
*H01L 23/00* (2006.01)
*H01L 23/13* (2006.01)

(52) U.S. Cl.
CPC .............. *H01L 24/90* (2013.01); *H01L 23/562* (2013.01); *H01L 23/13* (2013.01); *H01L 24/81* (2013.01)

(58) Field of Classification Search
CPC ........ H01L 24/90; H01L 23/562; H01L 23/13
USPC .................. 257/678, 686, 723, 718
See application file for complete search history.

(56) References Cited

U.S. PATENT DOCUMENTS 6,105,215 A * 8/2000 Lee .................... 24/458
6,301,113 B1 * 10/2001 Guerrero ............... 361/704

FOREIGN PATENT DOCUMENTS

JP          05-327159 A     12/1993
JP          11-163043 A      6/1999

* cited by examiner

*Primary Examiner* — Luan C Thai
(74) *Attorney, Agent, or Firm* — Squire Patton Boggs (US) LLP

(57) ABSTRACT

A semiconductor apparatus includes: a package substrate on which a semiconductor device is disposed; a mounting board over which the package substrate is mounted; a first restraint that penetrates through the mounting board and the package substrate, and restrains deformation of the mounting board and the package substrate in a direction in which the mounting board and the package substrate are separated from each other; and a second restraint that is disposed between the mounting board and the package substrate, and restrains deformation of the mounting board and the package substrate in a direction in which the mounting board and the package substrate are closer to each other.

16 Claims, 15 Drawing Sheets

FIG. 5A
FIG. 5B
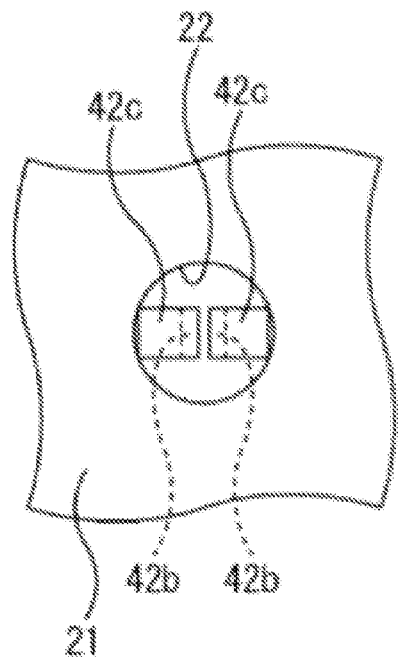
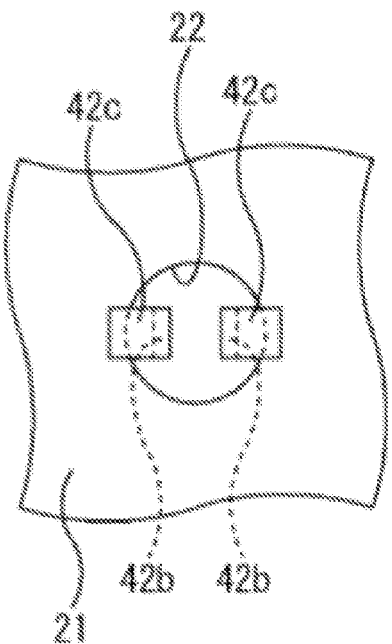

SEMICONDUCTOR APPARATUS AND MANUFACTURING METHOD THEREOF

CROSS-REFERENCE TO RELATED APPLICATION

This application is based upon and claims the benefit of priority of the prior Japanese Patent Application No. 2013-095562, filed on Apr. 30, 2013, the entire contents of which are incorporated herein by reference.

FIELD

The embodiments discussed herein are related to a semiconductor apparatus and a method of manufacturing the semiconductor apparatus.

BACKGROUND

In a semiconductor package in related art, a package substrate has a central processing unit (CPU) disposed thereon. One of semiconductor package structures is a ball grid array (BGA). To mount a BGA semiconductor package over a printed circuit board, reflow is conducted.

After the reflow, however, a solder ball on the package substrate may be separated from the printed circuit board, or a plurality of solder balls may be in contact with each other, causing a short circuit. That is, faulty connections may occur after the reflow. The larger the package substrate is, the more noticeable these faulty connections are.

Japanese Laid-open Patent Publication No. 11-163043 and Japanese Laid-open Patent Publication No. 5-327159 are examples of related art.

SUMMARY

According to an aspect of the invention, a semiconductor apparatus includes: a package substrate on which a semiconductor device is disposed; a mounting board over which the package substrate is mounted; a first restraint that penetrates through the mounting board and the package substrate, and restrains deformation of the mounting board and the package substrate in a direction in which the mounting board and the package substrate are separated from each other; and a second restraint that is disposed between the mounting board and the package substrate, and restrains deformation of the mounting board and the package substrate in a direction in which the mounting board and the package substrate are closer to each other, wherein the first restraint includes a head that is in contact with a first surface on a side of the mounting board that is farther from the package substrate, a hook that is openable and closable in a direction parallel to a second surface on a side of the package substrate that is farther from the mounting board, and that is hooked on the second surface, and a joining section that joins the head and the hook.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B illustrate a change in a hook;

DESCRIPTION OF EMBODIMENTS

In related art, only the CPU is mounted on the package substrate, and components such as a memory and an optical module are mounted on the outside of the package substrate. On the other hand, if the components such as the memory and the optical module are mounted on the package substrate, it is possible to reduce the area occupied by these components on the printed circuit board, achieving space saving and much higher performance. If the components other than the CPU are mounted on the package substrate, however, the package substrate becomes larger and the above faulty connections are noticeable, even when the components are mounted in high density. The inventors of the present application made intensive studies in order to avoid the faulty connections even when the package substrate becomes larger.

Embodiments will be concretely described below with reference to the attached drawings.

First Embodiment

Figure 1A:
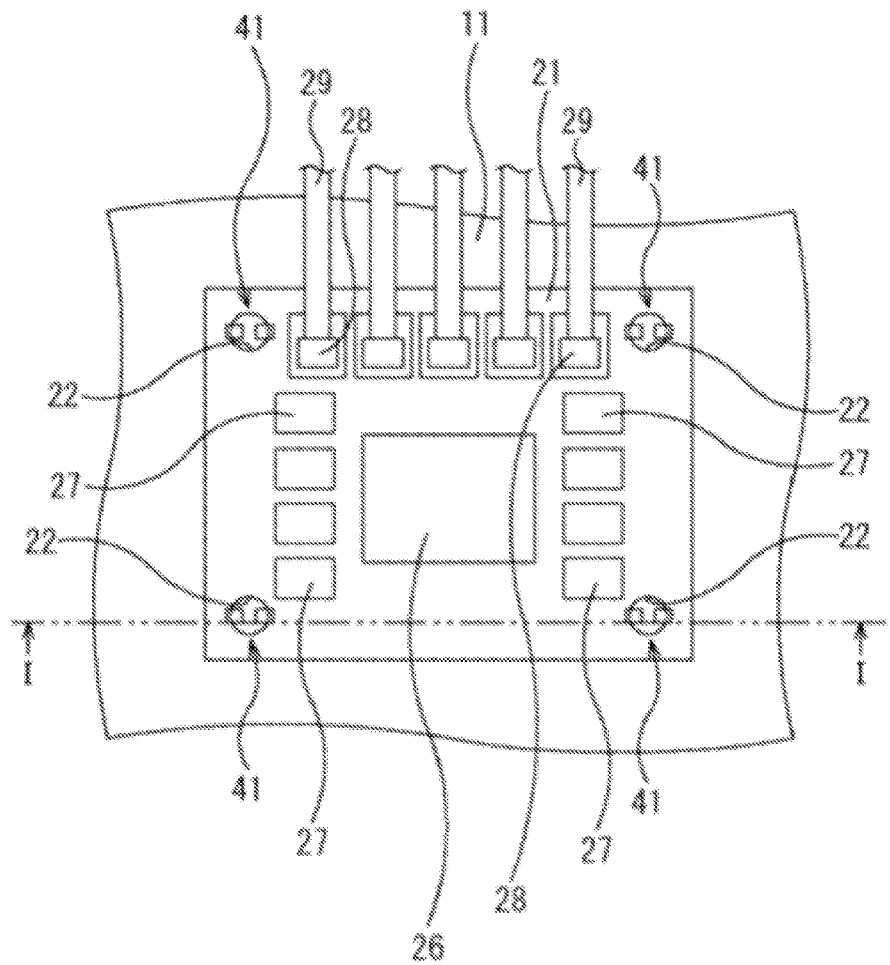
FIGS. 1A and 1B illustrate the structure of a semiconductor apparatus according to a first embodiment.
Figure 1B:
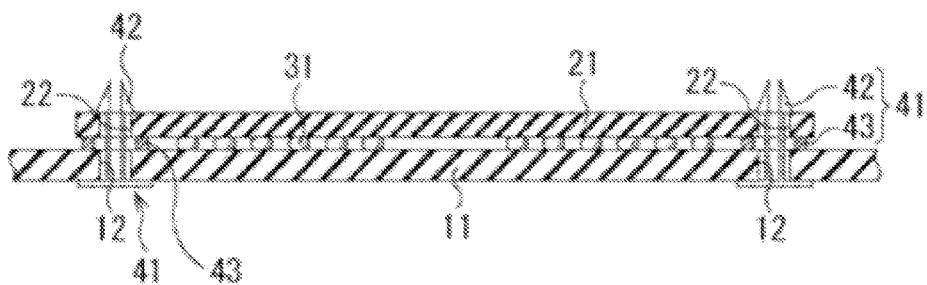

A first embodiment will first be described. FIGS. 1A and 1B illustrate the structure of a semiconductor apparatus according to the first embodiment. FIG. 1A is a plan view, and FIG. 1B is a sectional view along line IB-IB in FIG. 1A.

In the first embodiment, a package substrate 21 is mounted over a printed circuit board 11, as illustrated in FIGS. 1A and 1B. The package substrate 21 and the printed circuit board 11 are interconnected via conductive balls 31. The conductive ball 31 is, for example, a solder ball. A semiconductor device 26, memories 27, and optical modules 28 are disposed on the package substrate 21. The memories 27 and the optical modules 28 are connected to the semiconductor device 26. Optical fibers 29 are connected to the optical modules 28. The semiconductor device 26 is, for example, a CPU. The printed circuit board 11 is an example of a mounting board. Restraining pins 42 are disposed to penetrate through the printed circuit board 11 and the package substrate 21, and restrain deformation of the printed circuit board 11 and the package substrate 21 in a direction in which they are separated from each other. In addition, standoffs 43 are disposed between the printed circuit board 11 and the package substrate 21, and restrain deformation of the printed circuit board 11 and the package substrate 21 in a direction in which they are closer to each other. The restraining pin 42 is an example of a first restraint, and the standoff 43 is an example of a second restraint. The restraining pins 42 and the standoffs 43 are included in restraining devices 41.

Figure 2:
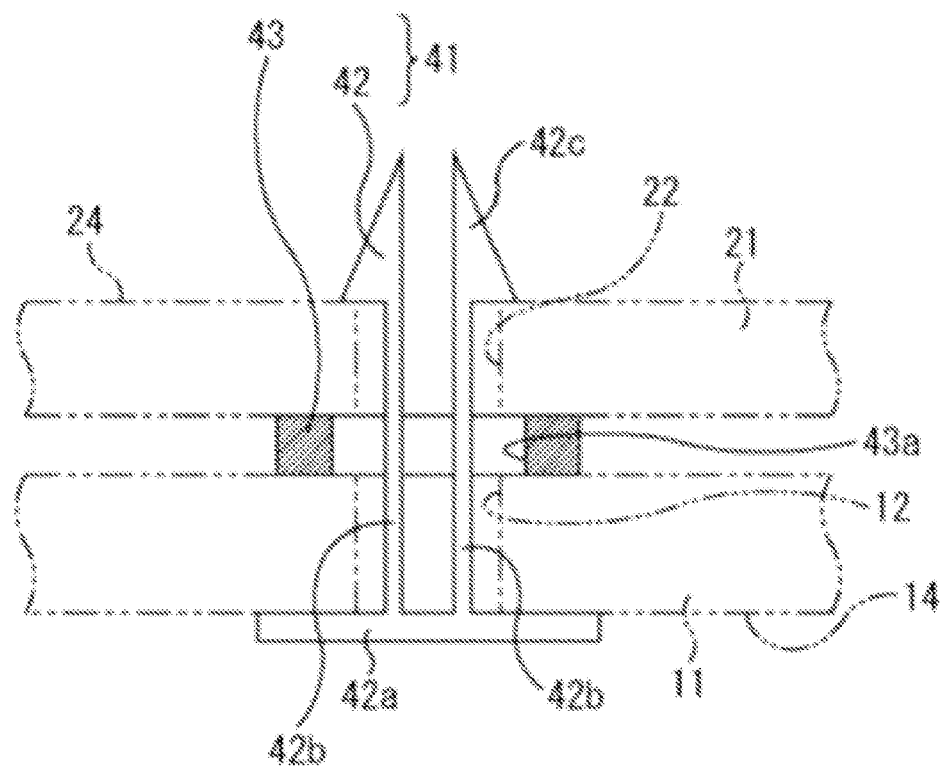
FIG. 2 illustrates a restraining device.

The restraining device 41 will now be described. FIG. 2 illustrates the restraining device 41.

As described above, the restraining pin 42 and the standoff 43 are included in the restraining device 41. The restraining pin 42 includes a head 42a, a spring 42b, and a hook 42c. In the package substrate 21, an opening 22 is formed away from the semiconductor device 26, the memories 27, and the optical modules 28. In the printed circuit board 11, an opening 12 is formed so as to face the opening 22.

The spring 42b penetrates through the opening 12 and the opening 22, and joins the head 42a and the hook 42c. The spring 42b is an example of a joining section. The spring 42b includes, for example, two rod-like or plate-like elastic members. The head 42a is in contact with a surface (first surface) 14 on the side of the printed circuit board 11 that is farther from the package substrate 21. The head 42a keeps the hook 42c and the spring 42b from falling out of the side of the package substrate 21. In response to elastic deformation of the spring 42b, the hook 42c is openable and closable in a direction parallel to a surface (second surface) 24 on the side of the package substrate 21 that is farther from the printed circuit board 11 (this direction may be referred to below as a lateral direction). The hook 42c has a tapered shape, in which the hook 42c becomes narrower as the distance from the head 42a increases. When stress in the lateral direction is not applied, the edge of the hook 42c on the side of the head 42a is hooked on the second surface 24. When the hook 42c is closed, the edge of the hook 42c on the side of the head 42a is smaller than the opening 12 and the opening 22. That is, the hook 42c may pass through the opening 12 and the opening 22 when the hook 42c is closed.

The standoff 43 has, for example, an annular shape like a washer. The standoff 43 is therefore provided with an opening 43a. The spring 42b penetrates through the opening 43a. The thickness of the standoff 43 is substantially identical to the design spacing between the printed circuit board 11 and the package substrate 21. The length of the spring 42b is substantially identical to the sum of the thickness of printed circuit board 11, the thickness of the standoff 43, and the thickness of the package substrate 21.

When stress in the lateral direction is not applied to the spring 42b, the spring 42b is away from the side surface of the opening 12 and the side surface of the opening 22. That is, there is a gap between the spring 42b and the side surface of the opening 12, and also a gap between the spring 42b and the side surface of the opening 22.

In the first embodiment, the openings 22 are provided in the four corners of the package substrate 21, and the openings 12 are provided in the printed circuit board 11 so as to face the openings 22. The restraining device 41 is attached to each of the four pairs of openings.

A semiconductor apparatus manufacturing method according to the first embodiment will now be described. FIGS. 3A to 3E are sectional views illustrating the semiconductor apparatus manufacturing method according to the first embodiment in process sequence. FIGS. 4A to 4E are enlarged sectional views of portions of FIGS. 3A to 3E.

Figure 3A:
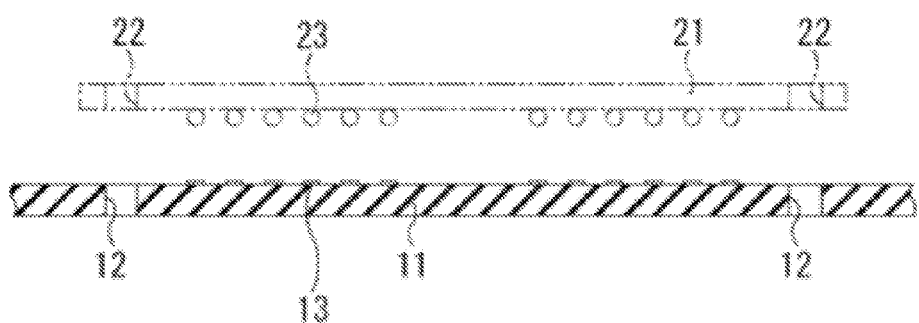
FIGS. 3A to 3E are sectional views illustrating a semiconductor apparatus manufacturing method according to the first embodiment in process sequence.
Figure 4A:
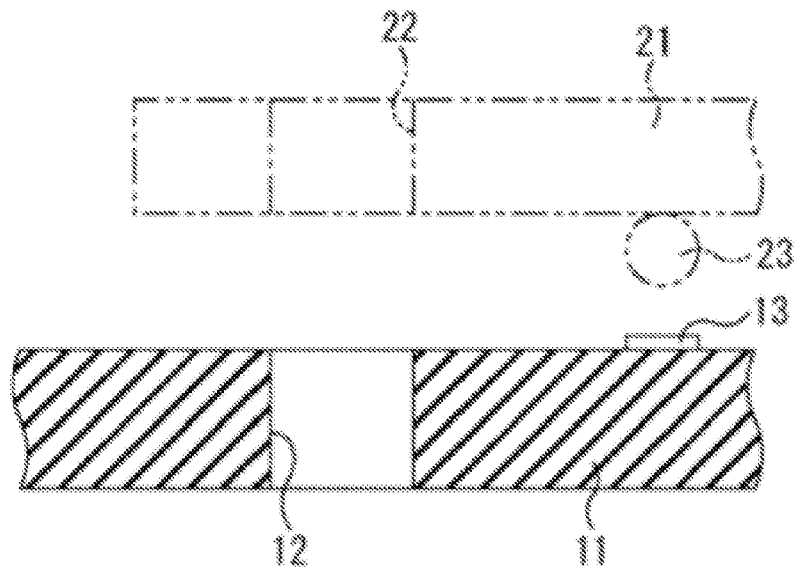
FIGS. 4A to 4E are enlarged sectional views of portions of FIGS. 3A to 3E.

First, pre-solders 13 are formed on the portions on the printed circuit board 11 on which the conductive balls 31 are to be formed. That is, the pre-solders 13 are formed on the portions facing conductive balls 23 on the package substrate 21, as illustrated in FIGS. 3A and 4A. The conductive ball 23 is, for example, a solder ball.

Figure 3B:
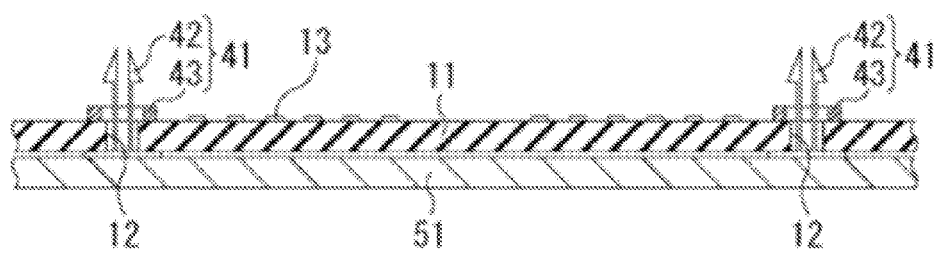
Figure 4B:
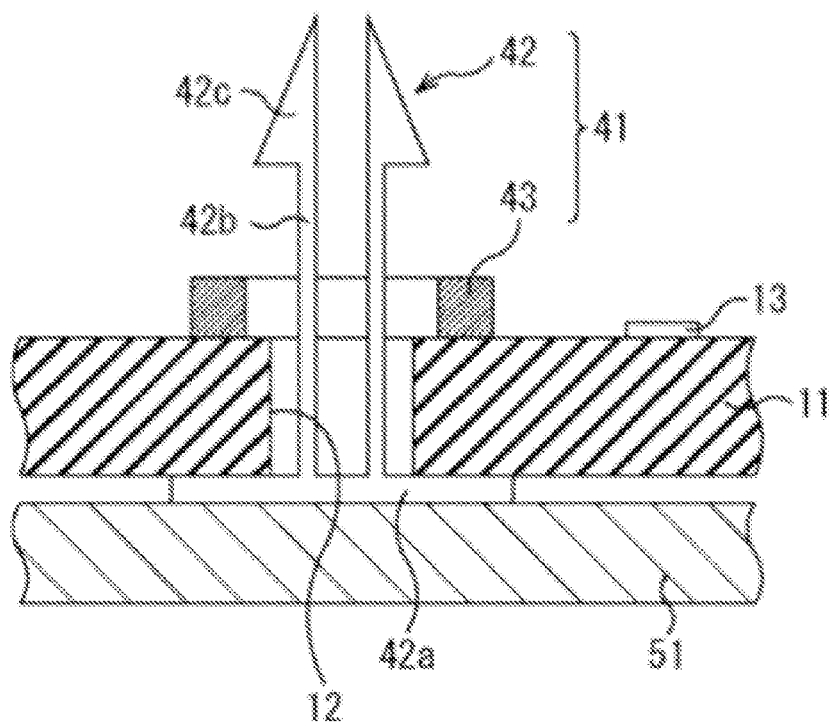

Next, the restraining pins 42 are inserted into the openings 12 from the surface on the side of the printed circuit board 11 that is farther from the package substrate 21, until the heads 42a come into contact with the printed circuit board 11, as illustrated in FIGS. 3B and 4B. In addition, the standoffs 43 are disposed on the printed circuit board 11 such that the springs 42b penetrate through the openings 43a. All of them are placed on a reflow jig 51 such that the heads 42a come into contact with the reflow jig 51.

Figure 3C:
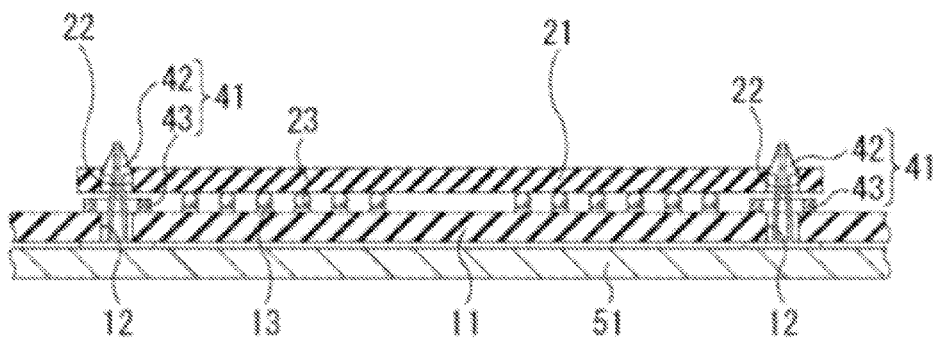
Figure 4C:
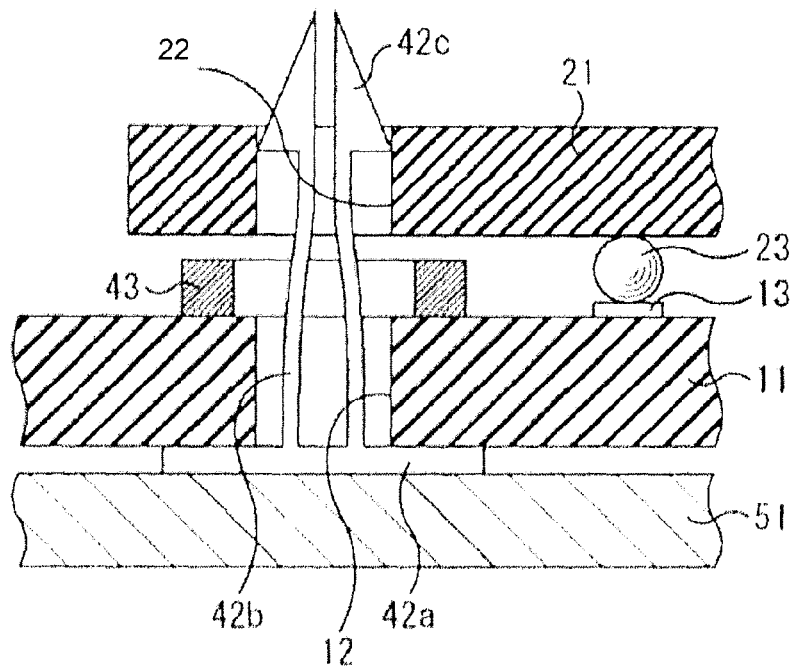

Then, the package substrate 21 is disposed over the printed circuit board 11 such that the hooks 42c enter the openings 22, as illustrated in FIGS. 3C and 4C. As described above, the thickness of the standoff 43 is substantially identical to the design spacing between the printed circuit board 11 and the package substrate 21. However, the sum of the diameter of the conductive ball 23 and the thickness of the pre-solder 13 is larger than the design spacing between the printed circuit board 11 and the package substrate 21. Therefore, the conductive balls 23 and the pre-solders 13 come into contact with each other, while there is a gap between the package substrate 21 and the standoffs 43. Accordingly, the hooks 42c remain in the openings 22 while being closed, as also illustrated in FIG. 5A.

Figure 3D:
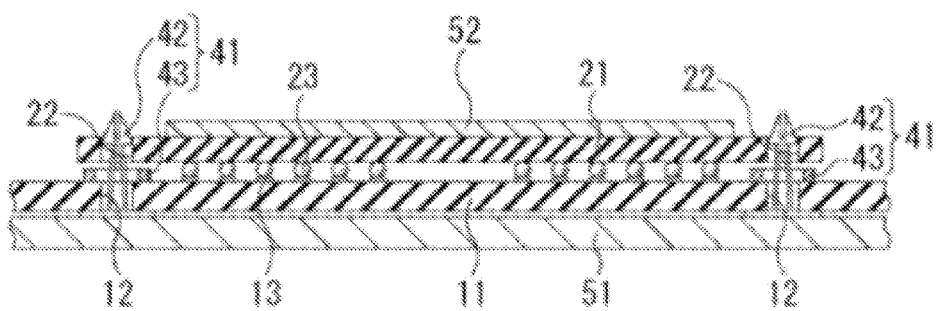
Figure 4D:
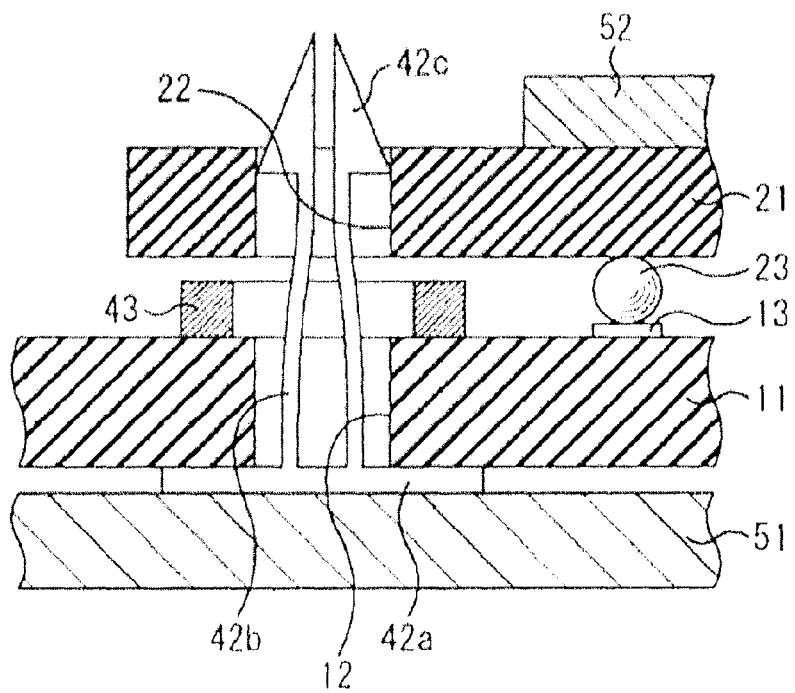

Next, a weight 52 is placed on the package substrate 21, as illustrated in FIGS. 3D and 4D. The mass of the weight 52 is not limited; the weight 52 may preferably have a mass large enough to press the package substrate 21 until the package substrate 21 comes into contact with the standoffs 43 when the conductive balls and the pre-solders 13 are melted during reflow.

Figure 3E:
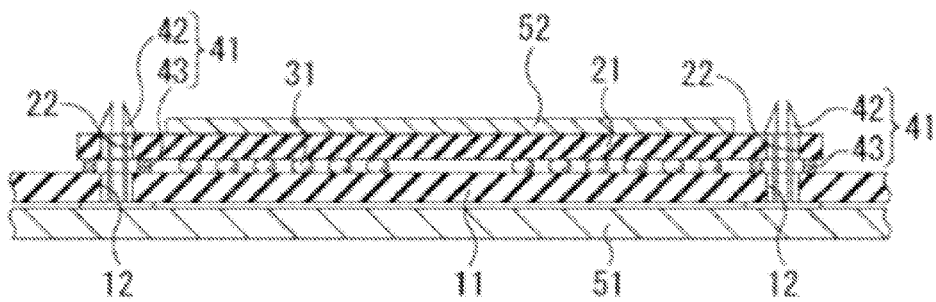
Figure 4E:
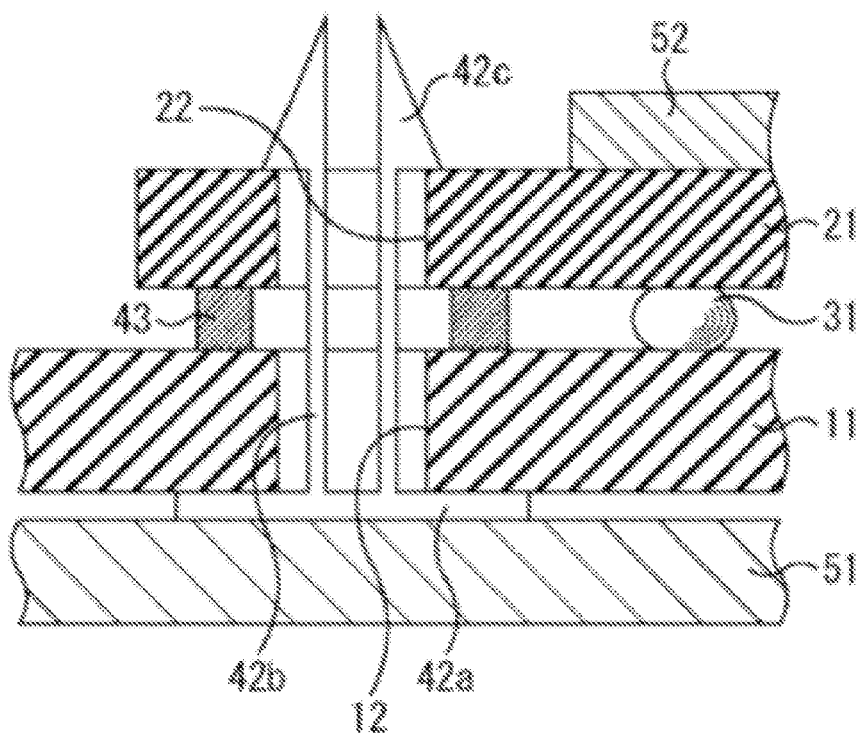

Then, the conductive balls 23 and the pre-solders 13 are melted by reflow, and the melted material is solidified. As a result, the conductive balls 31 are obtained, as illustrated in FIGS. 3E and 4E. As the conductive balls 23 and the pre-solders 13 are melted, the package substrate 21 is pressed by the weight 52 to gradually move down to the side of the printed circuit board 11, but stops at a point of contact with the standoffs 43. That is, the standoffs 43 control the spacing between the package substrate 21 and the printed circuit board 11. When the package substrate 21 comes into contact with the standoffs 43, the bottoms of the hooks 42c are located higher than the openings 22. Therefore, the hooks 42c project from the openings 22 and the restraint on the hooks 42c by the openings 22 is released. As a result, the hooks 42c spread and are hooked on the surface on the side of the package substrate 21 that is farther from the printed circuit board 11, as also illustrated in FIG. 5B.

The semiconductor apparatus according to the first embodiment is obtained in this way.

In the first embodiment described above, the restraining devices 41 avoid deformation of the printed circuit board 11 and the package substrate 21 both in a direction in which they are relatively separated from each other and in a direction in which they are relatively closer to each other. Accordingly, the conductive balls 31 are in the desired state after the reflow, and faulty connections may be avoided.

Figure 6A:
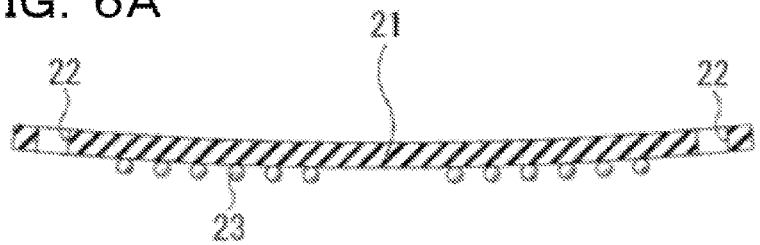
FIGS. 6A to 6D are sectional views illustrating an example of an effect of the first embodiment.
Figure 6B:
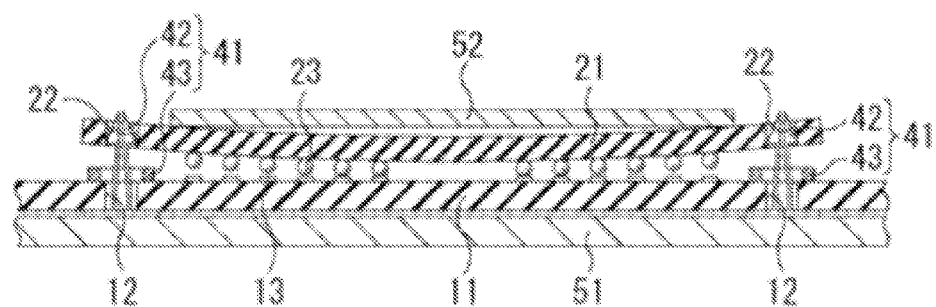
Figure 6C:
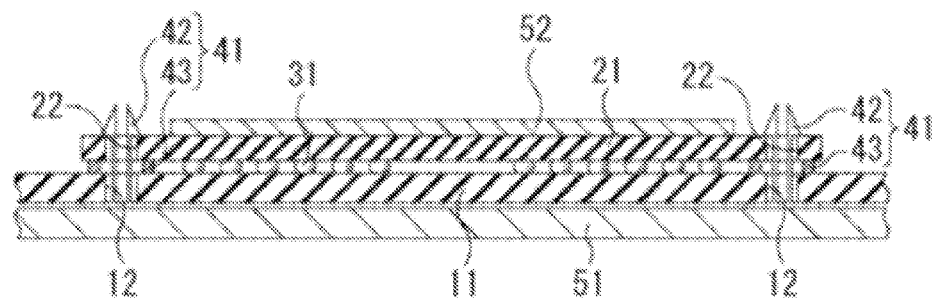

For example, the package substrate 21 may be warped so that the surface provided with the conductive balls 23 has a convex shape, as illustrated in FIG. 6A. The warping is not removed even when the weight 52 is placed, as illustrated in FIG. 6B. Then, when reflow is conducted, the warping of the package substrate 21 is removed during the reflow, as illustrated in FIG. 6C. This is because the reflow temperature at which the pre-solders 13 and the conductive balls 23 are melted is higher than the glass-transition temperature of a resin contained in the package substrate 21. After the reflow, the temperature of the package substrate 21 becomes lower than the glass-transition temperature, and thus stress for restoring the package substrate 21 to the shape it had before the reflow is applied to the package substrate 21.

Figure 6D:
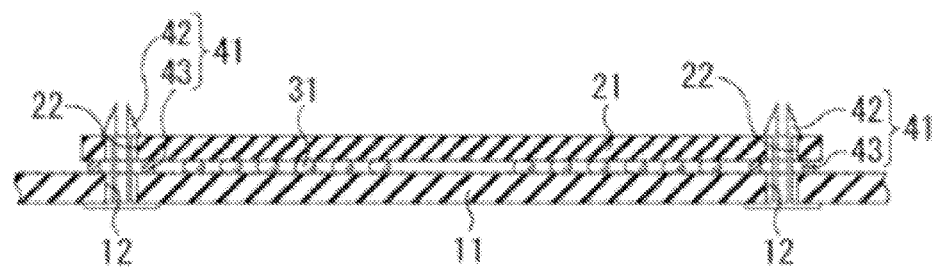

That is, the stress is applied such that the four sides of the package substrate 21 are separated from the printed circuit board 11. However, the four corners have already been restrained by the restraining devices 41. Therefore, even when the weight 52 and the reflow jig 51 are detached, the spacing between the package substrate 21 and the printed circuit board 11 is maintained as the thickness of the standoff 43, as illustrated in FIG. 6D. Accordingly, the conductive balls 31 are in the desired state after the reflow, and faulty connections may be avoided. The effect of avoiding faulty connections may also be obtained when the printed circuit board 11 is warped. This is because the reflow temperature is higher than the glass-transition temperature of a resin contained in the printed circuit board 11, the warping of the printed circuit board 11 is removed during the reflow, and that state is maintained by the restraining devices 41.

Figure 7A:
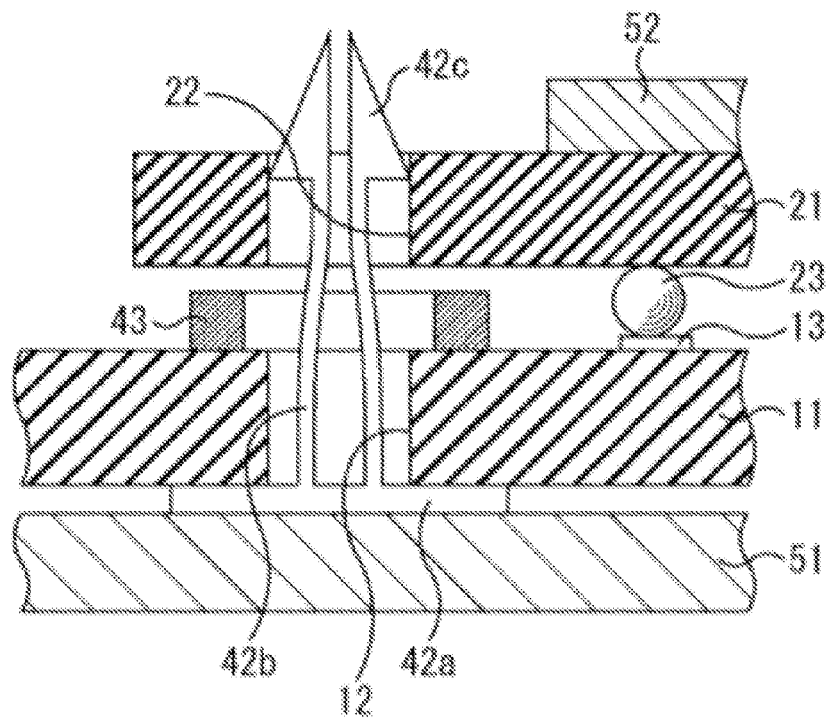
FIGS. 7A and 7B are sectional views illustrating another example of an effect of the first embodiment.
Figure 7B:
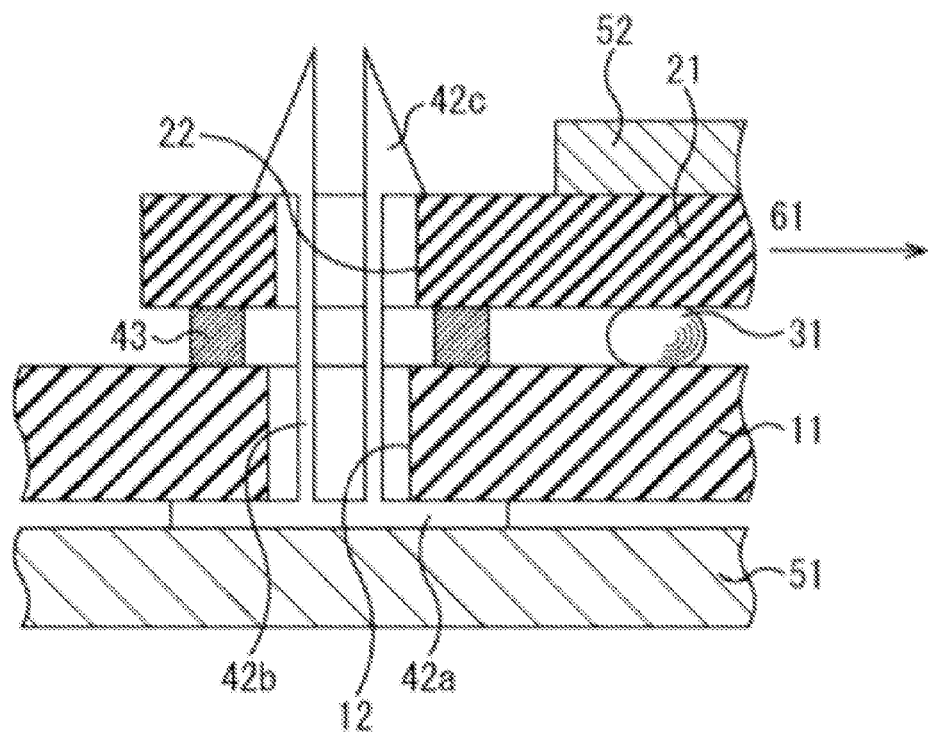

In this embodiment, there is a gap between the spring 42b and the side surface of the opening 12, and also a gap between the spring 42b and the side surface of the opening 22. Therefore, even if the conductive ball 23 and the pre-solder 13 are misaligned, for example, as illustrated in FIG. 7A, when they are melted, self-alignment 61 associated with the surface tension of the melted solder occurs, as illustrated in FIG. 7B. That is, the misalignment is removed. There may preferably be a gap between the spring 42b and the side surface of the opening 12, and also a gap between the spring 42b and the side surface of the opening 22; however, there may be only one of these gaps.

Second Embodiment

Figure 8A:
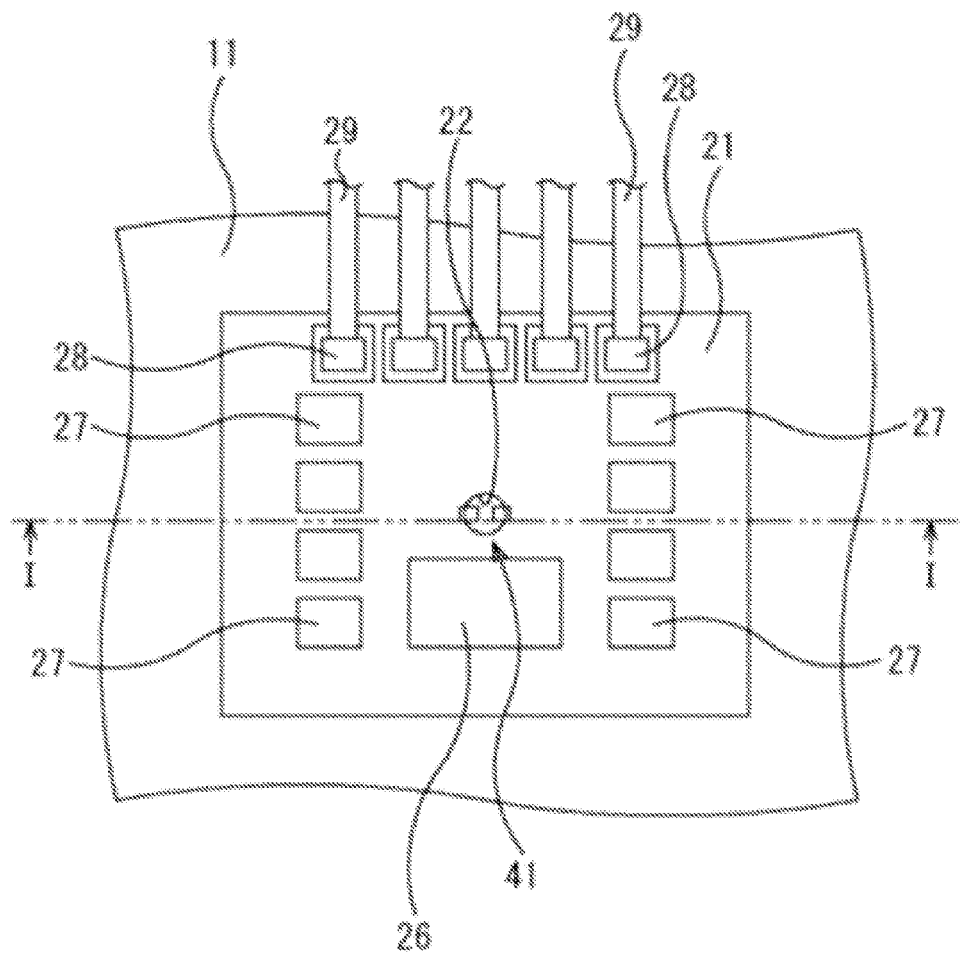
FIGS. 8A and 8B illustrate the structure of a semiconductor apparatus according to a second embodiment.
Figure 8B:
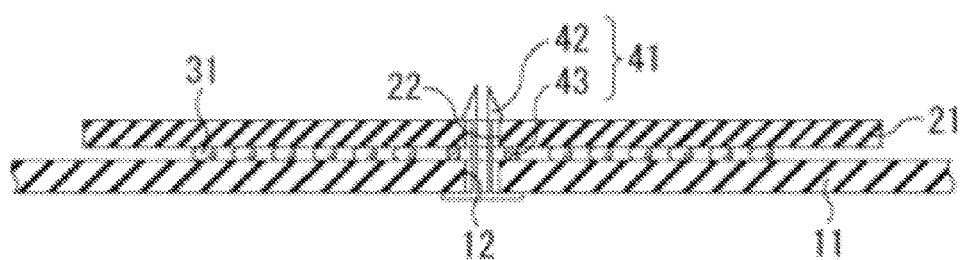

A second embodiment will now be described. FIGS. 8A and 8B illustrate the structure of a semiconductor apparatus according to the second embodiment. FIG. 8A is a plan view, and FIG. 8B is a sectional view along line VIIIB-VIIIB in FIG. 8A.

Unlike the first embodiment, in which the openings 22 are provided in the four corners of the package substrate 21, the opening 22 is provided in the central part of the package substrate 21 in the second embodiment, as illustrated in FIGS. 8A and 8B. Other structural features are the same as in the first embodiment.

Figure 9A:
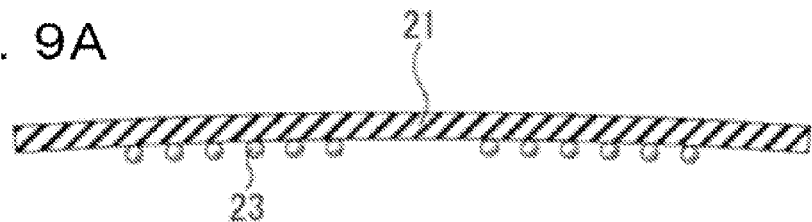
FIGS. 9A to 9D are sectional views illustrating an example of an effect of the second embodiment.
Figure 9B:
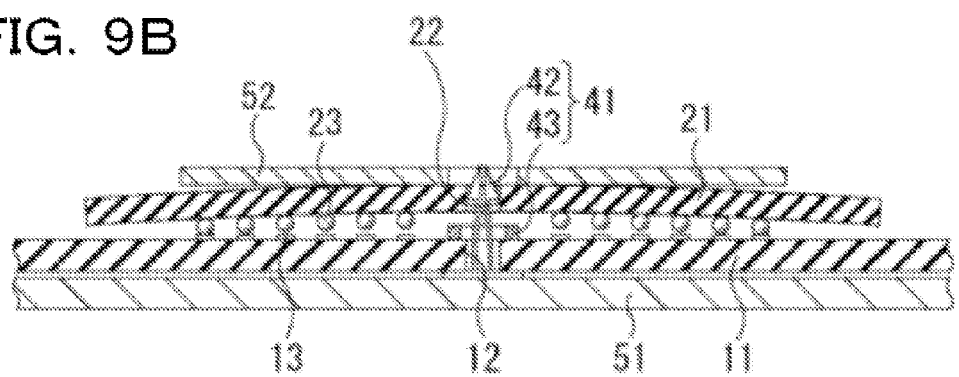
Figure 9C:
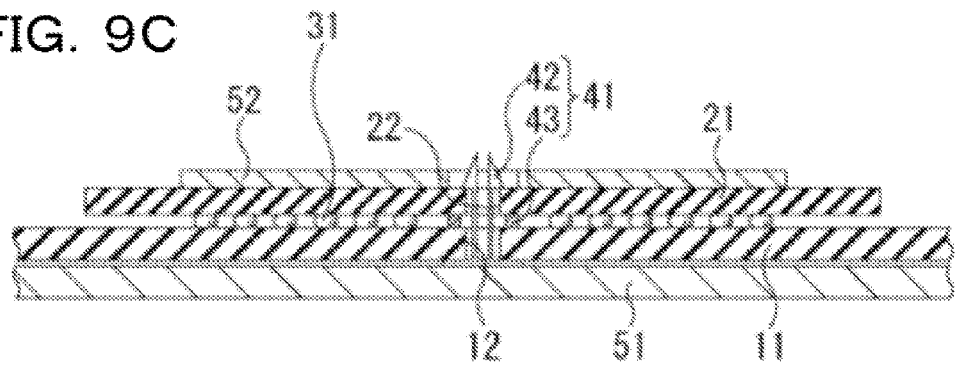

The first embodiment is especially effective when the package substrate 21 is warped so that the surface provided with the conductive balls 23 has a convex shape, as illustrated in FIG. 6A. However, the package substrate 21 may be warped so that the surface provided with the conductive balls 23 has a concave shape, as illustrated in FIG. 9A. The second embodiment is especially effective in this case. The warping is not removed even when the weight 52 is placed, as illustrated in FIG. 9B. However, when reflow is conducted, the warping is removed during the reflow, as illustrated in FIG. 9C. After the reflow, the temperature of the package substrate 21 becomes lower than the glass-transition temperature, and thus stress for restoring the package substrate 21 to the shape it had before the reflow is applied to the package substrate 21.

Figure 9D:
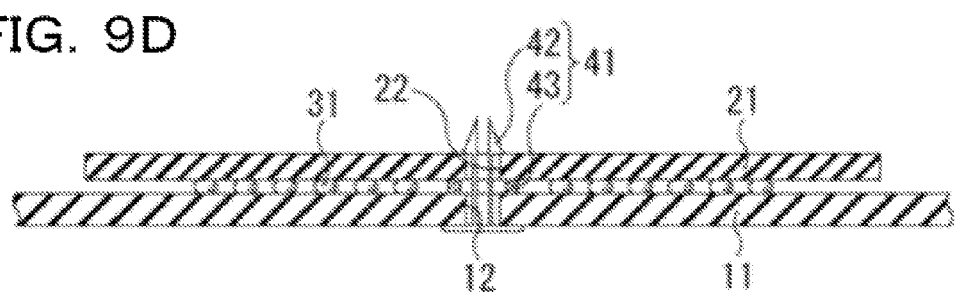

That is, the stress is applied such that the central part of the package substrate 21 is separated from the printed circuit board 11. However, the central part has already been restrained by the restraining device 41. Therefore, even when the weight 52 and the reflow jig 51 are detached, the spacing between the package substrate 21 and the printed circuit board 11 is maintained as the thickness of the standoff 43, as illustrated in FIG. 9D. Accordingly, the conductive balls 31 are in the desired state after the reflow, and faulty connections may be avoided. The effect of avoiding faulty connections may also be obtained when the printed circuit board 11 is warped. This is because the reflow temperature is higher than the glass-transition temperature of the resin contained in the printed circuit board 11, the warping of the printed circuit board 11 is removed during the reflow, and that state is maintained by the restraining device 41.

In addition, the second embodiment may provide the same self-alignment effect as the first embodiment.

Third Embodiment

Figure 10A:
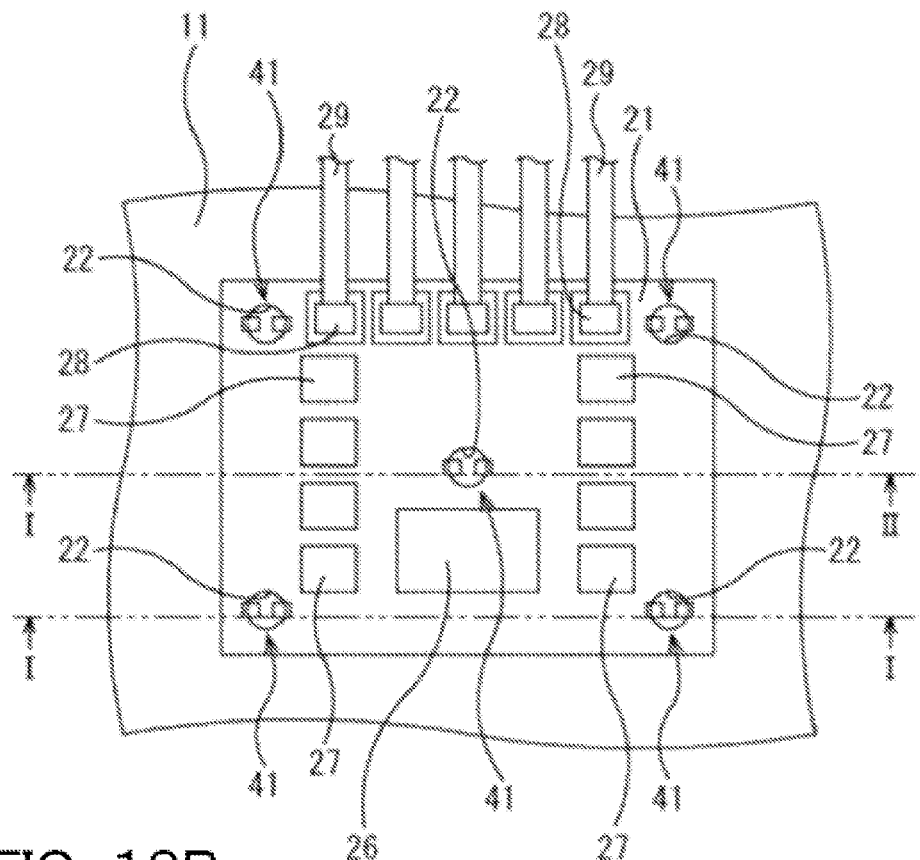
FIGS. 10A to 10C illustrate the structure of a semiconductor apparatus according to a third embodiment.
Figure 10B:
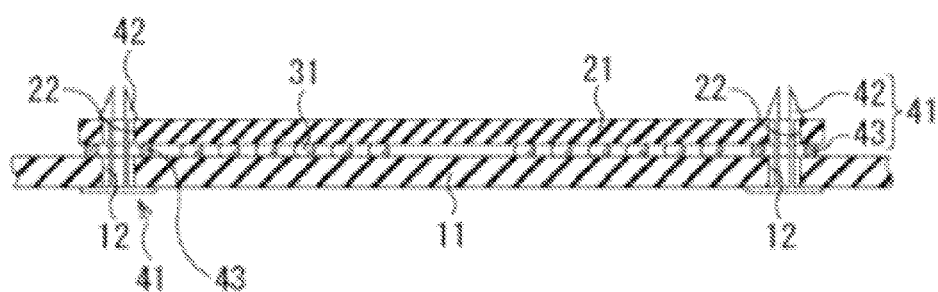
Figure 10C:
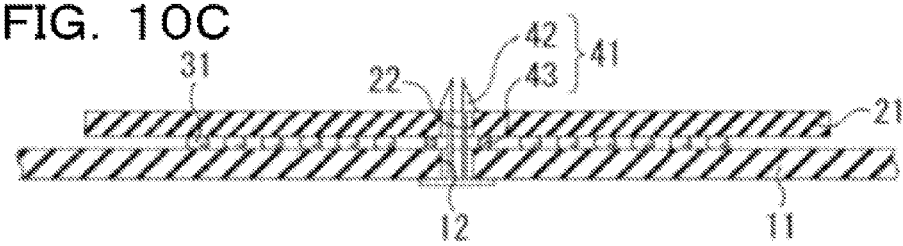

A third embodiment will now be described. FIGS. 10A to 10C illustrate the structure of a semiconductor apparatus according to the third embodiment. FIG. 10A is a plan view, FIG. 10B is a sectional view along line XB-XB in FIG. 10A, and FIG. 10C is a sectional view along line XC-XC in FIG. 10A.

The third embodiment is a combination of the first embodiment and the second embodiment, as illustrated in FIGS. 10A to 10C. That is, the restraining devices 41 are provided in two or more locations, which have different distances from the periphery of the package substrate 21. Therefore, faulty connections may be avoided more reliably, both when the package substrate 21 is warped so that the surface provided with the conductive balls 23 has a convex shape, as illustrated in FIG. 6A, and when the package substrate 21 is warped so that the surface provided with the conductive balls 23 has a concave shape, as illustrated in FIG. 9A. The effect of avoiding faulty connections more reliably may also be obtained when the printed circuit board 11 is warped.

Fourth Embodiment and Fifth Embodiment

Figure 11:
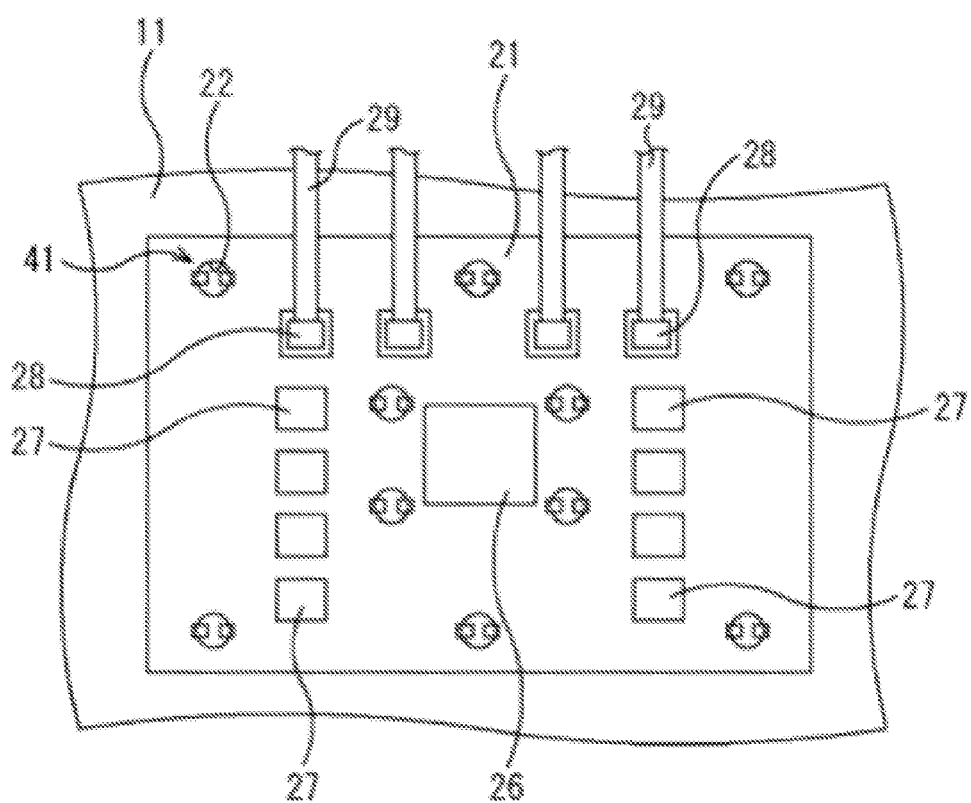
FIG. 11 illustrates the structure of a semiconductor apparatus according to a fourth embodiment.
Figure 12:
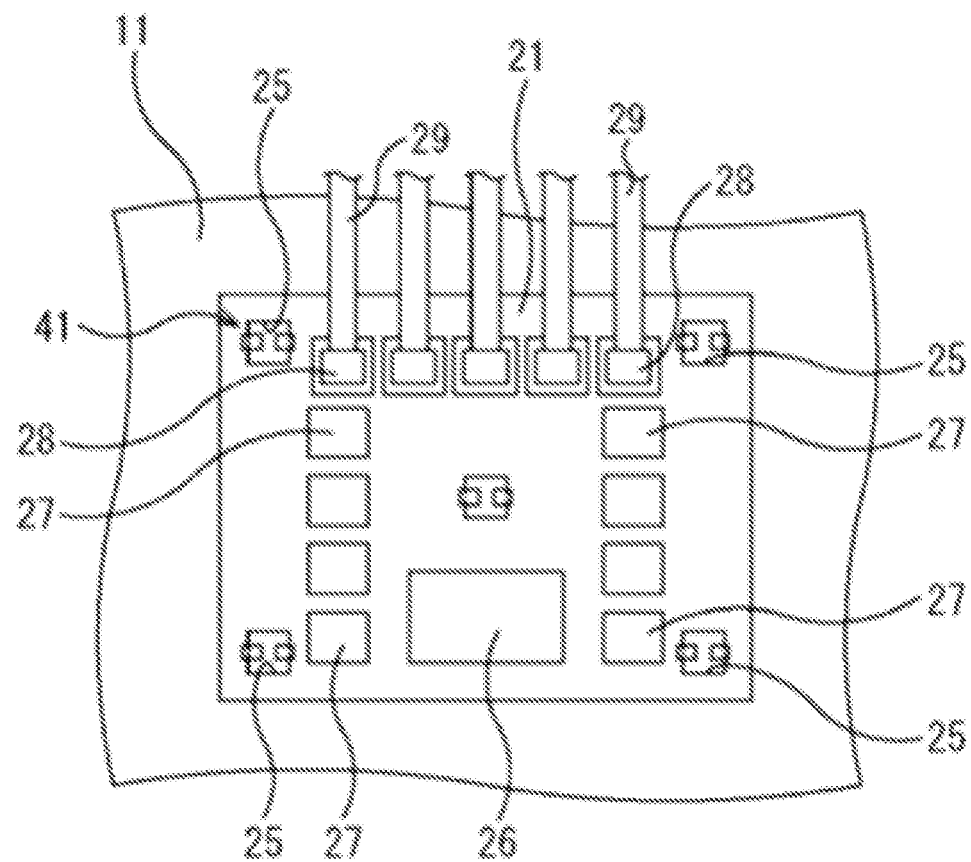
FIG. 12 illustrates the structure of a semiconductor apparatus according to a fifth embodiment.

The locations in which the restraining devices 41 are provided are not limited to the four corners and the central part of the package substrate 21. The restraining devices 41 may be provided in one or two or more locations depending on the layout or the like of the semiconductor device 26, the memories 27, and the optical modules 28, as depicted in a fourth embodiment illustrated in FIG. 11. When the restraining devices 41 are provided in various locations, it is also possible to avoid not only warping but also undulation and the like more reliably. The shape of the openings 12 does not have to be circular. Rectangular openings 25 may be formed, as depicted in a fifth embodiment illustrated in FIG. 12. When the circular opening 22 and the rectangular opening 25 are compared, the opening 22 has the advantage that the opening 22 is easily formed, while the opening 25 has the advantage that the hook 42c is easily hooked on the opening 25, for example.

In these embodiments, the memories 27 and the optical modules 28 are disposed on the package substrate 21, in addition to the semiconductor device 26. However, only the semiconductor device 26 may be disposed. In addition, components and the like other than the memories 27 and the optical modules 28 may also be disposed.

The material for the restraining pins 42 and the standoffs 43 is not limited; however, the restraining pins 42 and the standoffs 43 may preferably be made from metal such as stainless steel. This is because an excellent elasticity may be obtained at a low cost. A non-elastic member may be used instead of the spring 42b, provided that the hook 42c is openable and closable in the direction parallel to the surface 24.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
   a package substrate on which a semiconductor device is disposed;
   a mounting board over which the package substrate is mounted;
   a first restraint that penetrates through the mounting board and the package substrate, and restrains deformation of the mounting board and the package substrate in a direction in which the mounting board and the package substrate are separated from each other; and
   a second restraint that is disposed between the mounting board and the package substrate, and restrains deformation of the mounting board and the package substrate in a direction in which the mounting board and the package substrate are closer to each other,
   wherein the first restraint includes
      a head that is in contact with a first surface on a side of the mounting board that is farther from the package substrate,
      a hook that is openable and closable in a direction parallel to a second surface on a side of the package substrate that is farther from the mounting board, and that is hooked on the second surface, and
      a joining section that joins the head and the hook.

2. The semiconductor apparatus according to claim 1, wherein
   the joining section has an elastic member.

3. The semiconductor apparatus according to claim 1, wherein
   the first restraint penetrates through an opening provided in the second restraint.

4. The semiconductor apparatus according to claim 1, wherein
   there is a gap between a side surface of a first opening that is provided in the package substrate and through which the first restraint penetrates and the joining section.

5. The semiconductor apparatus according to claim 1, wherein
   there is a gap between a side surface of a second opening that is provided in the mounting board and through which the first restraint penetrates and the joining section.

6. The semiconductor apparatus according to claim 1, wherein
   the first restraint and the second restraint are provided in two or more locations, which have different distances from the periphery of the package substrate.

7. The semiconductor apparatus according to claim 1, wherein
   the first restraint is made from metal.

8. The semiconductor apparatus according to claim 1, wherein
   a component connected to the semiconductor device is disposed on the package substrate.

9. A semiconductor apparatus manufacturing method comprising:
   placing, over a mounting board, a package substrate on which a semiconductor device is disposed;
   mounting the package substrate over the mounting board by conducting reflow, and before the package substrate placing;
   providing a first restraint including a head that is in contact with a first surface on a side of the mounting board that is farther from the package substrate, a hook that is openable and closable in a direction parallel to a second surface on a side of the package substrate that is farther from the mounting board, and that is hooked on the second surface, and a joining section that joins the head and the hook, the first restraint being provided so that the hook and the joining section penetrate through the mounting board and the head comes into contact with the first surface; and
   providing, on the mounting board, a second restraint that restrains deformation of the mounting board and the package substrate in a direction in which the mounting board and the package substrate are closer to each other,
   wherein during the package substrate placing, the package substrate is placed so that the hook is located in an opening provided in the package substrate while the hook is closed, and
   wherein during the reflow, the package substrate is moved down to a side of the mounting board so that the hook projects from the opening and is hooked on the second surface.

10. The semiconductor apparatus manufacturing method according to claim 9, wherein
    the joining section has an elastic member.

11. The semiconductor apparatus manufacturing method according to claim 9, wherein
    during the second restraint providing, the second restraint is provided so that the hook and the joining section penetrate through an opening provided in the second restraint.

12. The semiconductor apparatus manufacturing method according to claim 9, wherein
    there is a gap between a side surface of a first opening that is provided in the package substrate and through which the first restraint penetrates and the joining section.

13. The semiconductor apparatus manufacturing method according to claim 9, wherein
    there is a gap between a side surface of a second opening that is provided in the mounting board and through which the first restraint penetrates and the joining section.

14. The semiconductor apparatus manufacturing method according to claim 9, wherein
    the first restraint and the second restraint are provided in two or more locations, which have different distances from the periphery of the package substrate.

15. The semiconductor apparatus manufacturing method according to claim 9, wherein
    the first restraint is made from metal.

16. The semiconductor apparatus manufacturing method according to claim 9, wherein
    a component connected to the semiconductor device is disposed on the package substrate.

* * * * *